US012722968B2

(12) United States Patent
Xia

(10) Patent No.: US 12,722,968 B2
(45) Date of Patent: Sep. 1, 2026

(54) MICRO-ELECTRO-MECHANICAL SYSTEM DEVICE

(71) Applicant: Vanguard International Semiconductor Corporation, Hsinchu (TW)

(72) Inventor: Jia Jie Xia, Singapore (SG)

(73) Assignee: Vanguard International Semiconductor Corporation, Hsinchu (TW)

(*) Notice: Subject to any disclaimer, the term of this patent is extended or adjusted under 35 U.S.C. 154(b) by 880 days.

(21) Appl. No.: 17/978,998

(22) Filed: Nov. 2, 2022

(65) Prior Publication Data

US 2024/0140781 A1 May 2, 2024

(51) Int. Cl.
*B81B 3/00* (2006.01)
*H04R 7/08* (2006.01)

(52) U.S. Cl.
CPC .......... *B81B 3/0021* (2013.01); *B81B 3/0013* (2013.01); *B81B 3/0072* (2013.01); *B81B 2203/0127* (2013.01); *H04R 7/08* (2013.01)

(58) Field of Classification Search
CPC . H04R 7/04–10; B81B 3/0072; B81B 3/0013; B81B 2203/0127; B81B 3/0021; B81B 2201/0235; B81B 2201/0257; B81B 2201/0264; B81B 2203/0118
See application file for complete search history.

(56) References Cited

U.S. PATENT DOCUMENTS

| | | | | |
|---|---|---|---|---|
| 9,055,372 | B2 | 6/2015 | Grosh | |
| 2013/0109990 | A1 | 5/2013 | Akingba | |
| 2020/0213770 | A1* | 7/2020 | Duan | H04R 17/02 |
| 2020/0351595 | A1* | 11/2020 | Rusconi Clerici Beltrami | H04R 17/00 |
| 2022/0024753 | A1 | 1/2022 | Xia | |
| 2022/0024754 | A1 | 1/2022 | Xia | |
| 2022/0140225 | A1 | 5/2022 | Xia | |
| 2022/0332568 | A1* | 10/2022 | Barsukou | B81B 3/0021 |
| 2023/0217174 | A1* | 7/2023 | Dan | H04R 7/06 381/112 |

FOREIGN PATENT DOCUMENTS

| | | | | |
|---|---|---|---|---|
| CN | 112601169 A | * 4/2021 | H04R 23/02 |
| CN | 114105077 A | 3/2022 | |
| CN | 114604817 A | 6/2022 | |
| TW | 202209515 A | 3/2022 | |

* cited by examiner

*Primary Examiner* — Steven B Gauthier
*Assistant Examiner* — Sun Mi Kim King
(74) *Attorney, Agent, or Firm* — Winston Hsu

(57) ABSTRACT

A MEMS device includes a substrate having a cavity, and a MEMS structure disposed over the cavity and attached to the substrate. The MEMS structure includes a plurality of cantilever portions, where each cantilever portions includes a free end and an anchor end. The MEMS device further includes a membrane disposed over the MEMS structure and includes a plurality of protruding portions respectively connected to the free ends of the cantilever portions. In addition, the MEMS device includes a gap between the MEMS structure and the membrane, where the gap surrounds the protruding portions.

20 Claims, 10 Drawing Sheets

MICRO-ELECTRO-MECHANICAL SYSTEM DEVICE

BACKGROUND OF THE INVENTION

1. Field of the Invention

The present disclosure relates generally to micro-electro-mechanical system (MEMS) devices, and more particularly to MEMS devices including a membrane vertically coupled with a MEMS structure.

2. Description of the Prior Art

A micro-electromechanical system (MEMS) device is a microscopic device that is fabricated through general semiconductor processes, such as depositing or selective etching material layers. The microscopic devices include both the electronic and mechanical function which is operated based on, for instance, electromagnetic, electrostrictive, thermoelectric, piezoelectric, or piezoresistive effects. Therefore, MEMS structures are often applied to microelectronics such as accelerometer, gyroscope, acoustic sensor, etc.

A conventional piezoelectric MEMS sensor including a diaphragm has been used in most applications. The diaphragm has a cantilever structure that can bend or vibrate under sound pressure. The bending or vibration of the cantilever structure can cause stress in the diaphragm and thus generate corresponding electrical signals. However, stress generated by the cantilever structure is unevenly distributed, thereby greatly affecting the performance of the piezoelectric MEMS sensor, for example, causing low sensitivity of the piezoelectric MEMS sensor. Accordingly, there is a need to improve the sensitivity of the MEMS sensor.

SUMMARY OF THE INVENTION

In view of this, embodiments of the present disclosure provide MEMS devices to improve the sensitivity thereof. The MEMS devices of the present disclosure include a membrane vertically coupled with a MEMS structure to increase sensing area, thereby improving the sensitivity of the MEMS devices.

According to one embodiment of the present disclosure, a MEMS device is provided and includes a substrate, a MEMS structure, a membrane and a gap between the MEMS structure and the membrane. The substrate has a cavity and the MEMS structure is disposed over the cavity and attached to the substrate. The MEMS structure includes a plurality of cantilever portions, and each of the plurality of cantilever portions includes a free end and an anchor end. The membrane is disposed over the MEMS structure and includes a plurality of protruding portions respectively connected to the free ends of the plurality of cantilever portions. In addition, the gap surrounds the plurality of protruding portions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
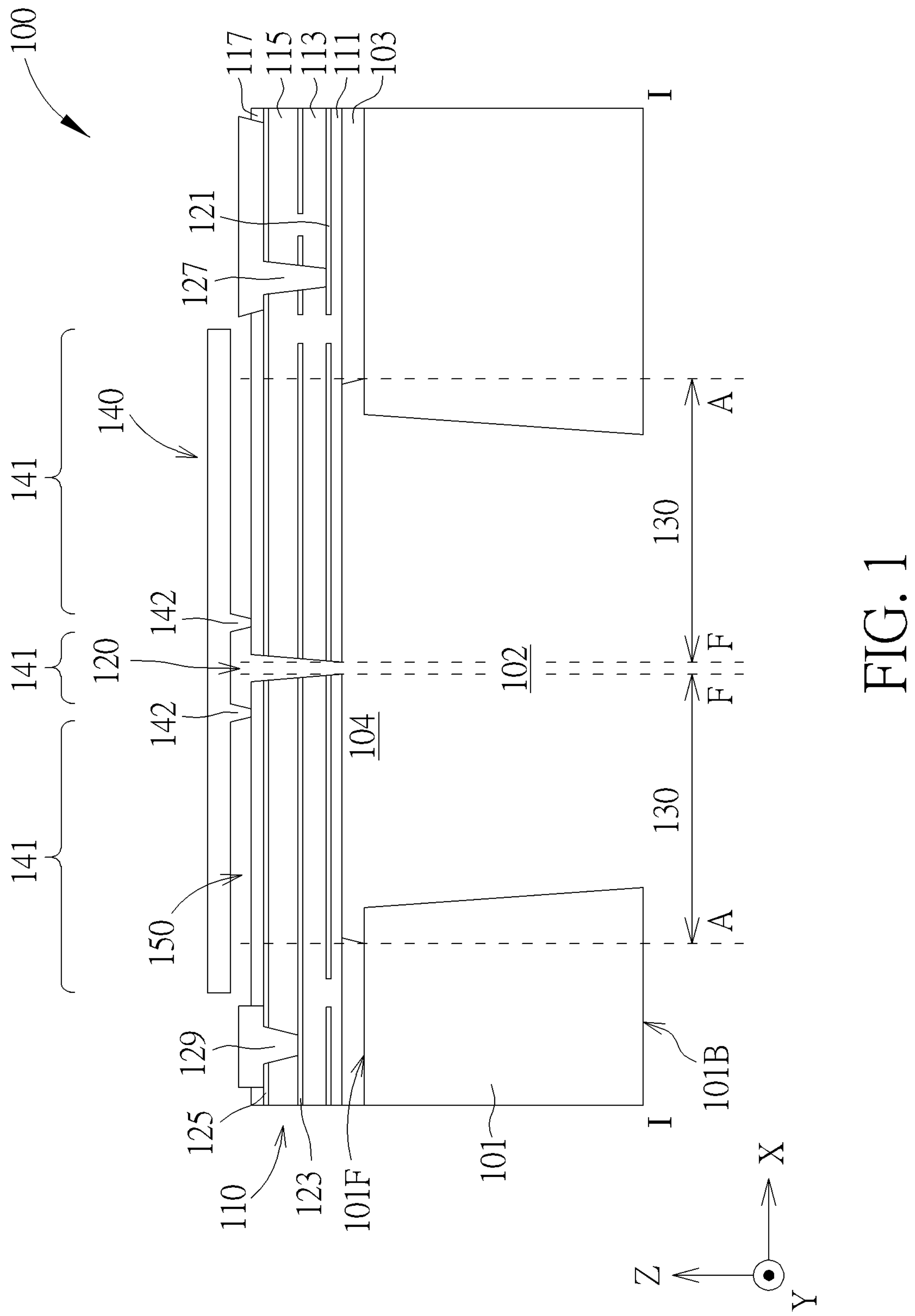
FIG. 1 shows a schematic cross-sectional diagram of a MEMS device according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath”, “below”, “lower”, “under”, “on”, “over”, “above”, “upper”, “bottom”, “top” and the like, may be used herein for ease of description to describe one element or feature’s relationship to another element (s) or feature (s) as illustrated in the figures. The spatially relative terms are intended to encompass different orientations of the device in use or operation in addition to the orientation depicted in the figures. For example, if the device in the figures is turned over, elements described as “below” and/or “under” other elements or features would then be oriented “above” and/or “over” the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first", "second", and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that may vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to MEMS devices including a membrane vertically coupled with a MEMS structure. The MEMS structure includes a plurality of cantilever portions, where each cantilever portion includes a free end and an anchor end. The free end of the cantilever portion may bend and vibrate during the operation of the MEMS device that causes stress in the cantilever portion and stress is mostly concentrated at the anchor end of the cantilever portion. The membrane provides a larger sensing area to sense environmental signals such as pressure, velocity, gas, molecular, etc., and is connected to the free ends of the cantilever portions to increase sensing area and enhance electrical signal output, thereby improving the sensitivity of the MEMS devices.

In addition, the membrane is vertically integrated with the cantilever portions of the MEMS structure, thereby increasing sensing area without enlarging the dimensions of the MEMS devices. For the MEMS structure, the number of the cantilever portions may be increased and the dimensions of the cantilever portions may be reduced to further increase electrical signal output while have the same sensing area without enlarging the dimensions of the MEMS structure. The MEMS structure is applicable for both piezoelectric and piezoresistive sensors. The MEMS devices are applicable for a pressure sensor, a microphone, an energy harvester, an accelerometer, etc.

FIG. 1 shows a schematic cross-sectional diagram of a MEMS device 100 according to one embodiment of the present disclosure. As shown in FIG. 1, the MEMS device 100 includes a substrate 101 having a cavity 102. The substrate 101 may be a semiconductor substrate, for example a silicon (Si) wafer or other suitable semiconductor wafer. In some embodiments, the cavity 102 may penetrate the substrate 101. In other embodiments, the cavity 102 may not penetrate the substrate 101 and is extended from a front surface 101F of the substrate 101 to a position in the height of the substrate 101, where the front surface 101F is adjacent to a MEMS structure 110. The MEMS structure 110 includes an interrupted portion 120 penetrating the MEMS structure 110 and disposed above the cavity 102 to form a plurality of cantilever portions 130. In some embodiments, each cantilever portion 130 may be a cantilevered diaphragm that is a polygon in shape, such as a triangle, a rectangle, an interdigitated shape, etc. Alternatively, each cantilever portion 130 may have curved edges, such as a circle, an ellipse, etc. In some embodiments, the cantilever portions 130 may have a combination of several shapes. The cantilever portions 130 may be arranged in an array.

In addition, the MEMS device 100 further includes a sacrificial layer 103 disposed between the substrate 101 and the MEMS structure 110. The sacrificial layer 103 has an opening 104 connected to the interrupted portion 120 and the cavity 102. The width of the opening 104 in an X-axial direction may be larger than the width of the cavity 102. In some embodiments, the material of the sacrificial layer 103 may be $SiO_2$ or other suitable dielectric materials. The MEMS structure 110 is attached to the sacrificial layer 103 and the substrate 101. Each cantilever portion 130 includes a free end F and an anchor end A. The anchor ends A of the cantilever portions 130 are attached to the sacrificial layer 103 and the substrate 101. The free ends F of the cantilever portions 130 are adjacent to the interrupted portion 120 of the MEMS structure 110.

In one embodiment, the MEMS structure 110 includes a first electrode layer 121, a second electrode layer 123, a third electrode layer 125, a sensing material layer 113 disposed between the first electrode layer 121 and the second electrode layer 123, and another sensing material layer 115 disposed between the second electrode layer 123 and the third electrode layer 125. In another embodiment, the MEMS structure 110 includes the first electrode layer 121, the second electrode layer 123 and the sensing material layer 113 disposed between the first electrode layer 121 and the second electrode layer 123. In other embodiments, the MEMS structure 110 may include more than three electrode layers and more than two sensing material layers, where one sensing material layer is sandwiched between two electrode layers.

In some embodiments, the materials of the first electrode layer 121, the second electrode layer 123, the third electrode layer 125 and other electrode layers may be Mo, Al, Pt, Ru, Ti, other suitable conductive material, or a combination thereof. In the embodiments of the present disclosure, the sensing material layers 113 and 115 and other sensing material layers may be a piezoelectric material, a piezoresistive material or other suitable sensing materials. The piezoelectric material is for example aluminum nitride (AlN), AlN doped with scandium (ScAlN), zinc oxide (ZnO), lead zirconate titanate (PZT), gallium nitride (GaN), etc. The piezoresistive material is for example doped silicon such as p-type Si, silicon carbide (SiC), etc.

As shown in FIG. 1, in one embodiment, the MEMS structure 110 further includes a seed layer 111 disposed on the bottom surface of the first electrode layer 121, and a passivation layer 117 disposed on the top surface of the third electrode layer 125. The interrupted portion 120 also penetrates the passivation layer 117 and the seed layer 111. In some embodiments, the materials of the seed layer 111 and the passivation layer 117 may be AlN, $SiO_2$ or SiON, but not limited thereto. The MEMS structure 110 further includes a contact pad 127 passing through the passivation layer 117, disposed on the third electrode layer 125 and electrically coupled to the first electrode layer 121 through a via. The MEMS structure 110 further includes another contact pad 129 passing through the passivation layer 117, disposed on the third electrode layer 125 and electrically coupled to the second electrode layer 123 through another via. The electrical signals generated by the sensing material layers 113 and 115 may be transmitted to an outer circuit through the electrode layers 121, 123 and 125 and the contact pads 127 and 129. In some embodiments, the material of the contact pads 127 and 129 may be AlCu or other suitable conductive materials.

According to embodiments of the present disclosure, the MEMS device 100 further includes a membrane 140 vertically coupled with the MEMS structure 110. The membrane 140 includes a suspended portion 141 vertically separated from the MEMS structure 110 and a plurality of protruding portions 142 respectively connected to the free ends F of the cantilever portions 130. For example, the protruding portions 142 are connected to the passivation layer 117 at the free ends F of the cantilever portions 130. There is a gap 150 between the MEMS structure 110 and the suspended portion 141 of the membrane 140. The gap 150 surrounds the protruding portions 142. The protruding portions 142 are laterally separated from each other by the gap 150. Each protruding portion 142 may be in a columnar shape. The membrane 140 is an integrated structure including the protruding portions 142. The material of the membrane 140 may be a semiconductor material such as silicon or polysilicon, a metal material such as Al, or a polymer material such as polyimide.

During the operation of the MEMS device 100, when environmental signals such as sound waves exerts acoustic pressure on or electrical signals are applied to the MEMS structure 110, the free ends F of the cantilevered portions 130 of the MEMS structure 110 may bend or vibrate and max stress occurs close to the anchor ends A of the cantilevered portions 130. According to the embodiments of the present disclosure, the membrane 140 is used as an additional larger sensing layer to sense the environmental signals. The membrane 140 connected to the free ends F of the cantilever portions 130 can increase the sensing area and enhance the max stress at the anchor ends A of the cantilevered portions 130, thereby improving the sensitivity of the MEMS device 100. Moreover, the dimensions such as the length, the width and the thickness of the membrane 140 may be adjusted to further control the bend and the vibration frequency of the cantilevered portions 130, thereby improving the performance of the MEMS device. Furthermore, the membrane 140 is vertically coupled with the MEMS structure 110 without enlarging the area of the MEMS device. Therefore, the sensitivity of the MEMS device 100 is improved without increasing the dimensions in XY plane of the MEMS device 100.

Figure 2:
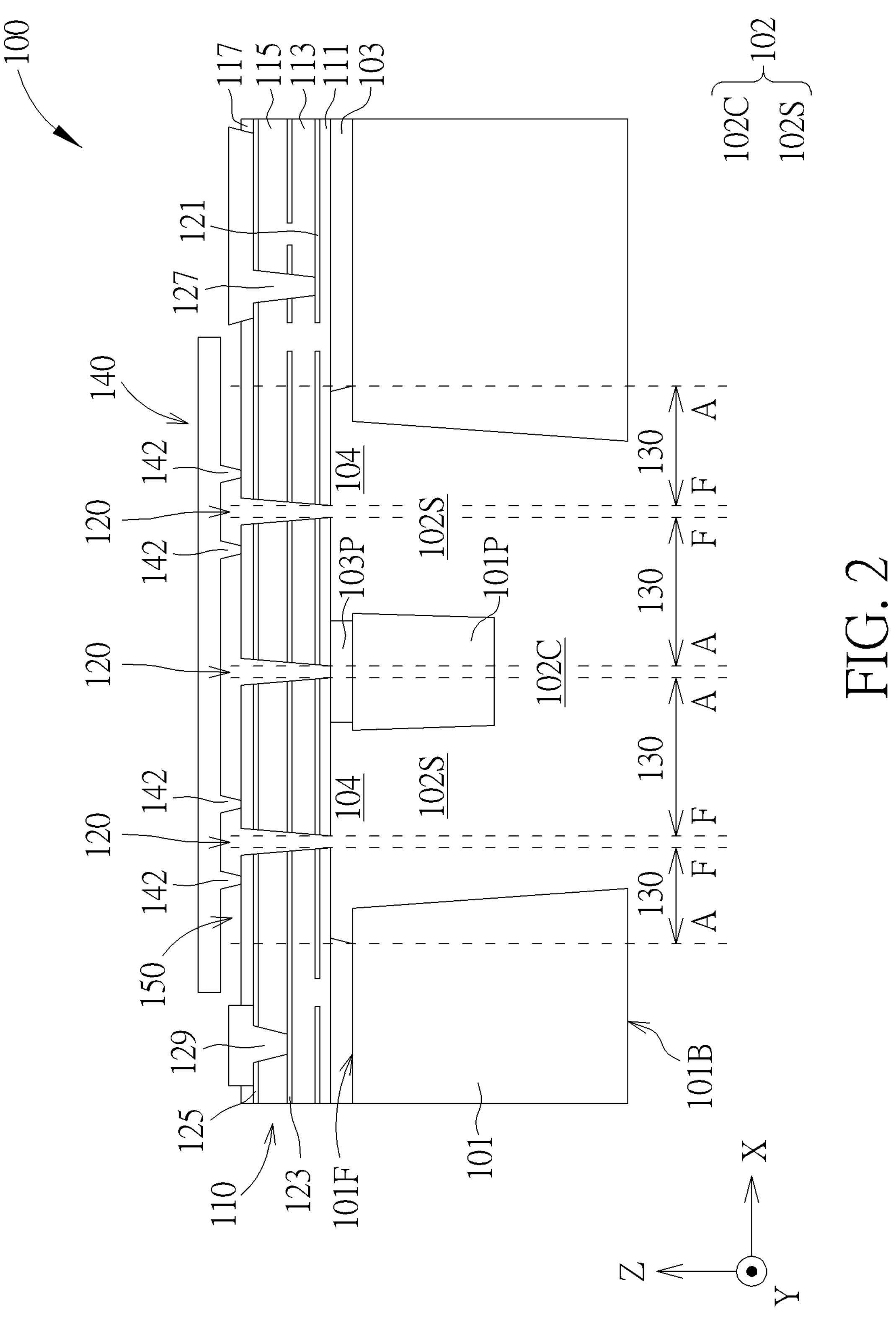
FIG. 2 shows a schematic cross-sectional diagram of a MEMS device according to another embodiment of the present disclosure.

FIG. 2 shows a schematic cross-sectional diagram of a MEMS device 100 according to another embodiment of the present disclosure. As shown in FIG. 2, the MEMS device 100 includes a substrate 101 having a common cavity 102C and a plurality of sub-cavities 102S. The common cavity 102C is extended from the back surface 101B of the substrate 101 to a position in the height of the substrate 101. The sub-cavities 102S are extended from the front surface 101F of the substrate 101 to the aforementioned position in the height of the substrate 101. The common cavity 102C and the sub-cavities 102S may be formed respectively by two different photo-masks and two etching processes. The sub-cavities 102S are separated from each other by a portion 101P of the substrate 101. The common cavity 102C is connected to the sub-cavities 102S. The common cavity 102C and the sub-cavities 102S are together referred to as a cavity 102 of the substrate 101. The MEMS device 100 further includes a sacrificial layer 103 disposed between the substrate 101 and a MEMS structure 110. The sacrificial layer 103 has a portion 103P disposed between the portion 101P of the substrate 101 and the MEMS structure 110. Moreover, the sacrificial layer 103 has a plurality of openings 104 respectively connected to the sub-cavities 102S.

The difference between the MEMS devices 100 of FIG. 2 and FIG. 1 is that the MEMS structure 110 of FIG. 2 includes more interrupted portions 120 that penetrate the MEMS structure 110 to form more cantilever portions 130. The anchor ends A of the cantilevered portions 130 are attached to the sacrificial layer 103 and the substrate 101, or attached to the portion 103P of the sacrificial layer 103 and the portion 101P of the substrate 101. The free ends F of the cantilever portions 130 are adjacent to the interrupted portions 120. In addition, the membrane 140 of the MEMS structure 110 of FIG. 2 includes more protruding portions 142 respectively connected to the free ends F of the cantilever portions 130. In this embodiment, the MEMS structure 110 includes more and smaller cantilever portions 130 in the same area as the embodiment of FIG. 1. The more and smaller cantilever portions 130 of this embodiment can generate more anchor ends A and more free ends F to further increase electrical signal output, thereby improving the sensitivity of the MEMS device 100. The materials and the other details of the features of the MEMS device 100 of FIG. 2 may refer to the aforementioned description of FIG. 1.

Figure 3:
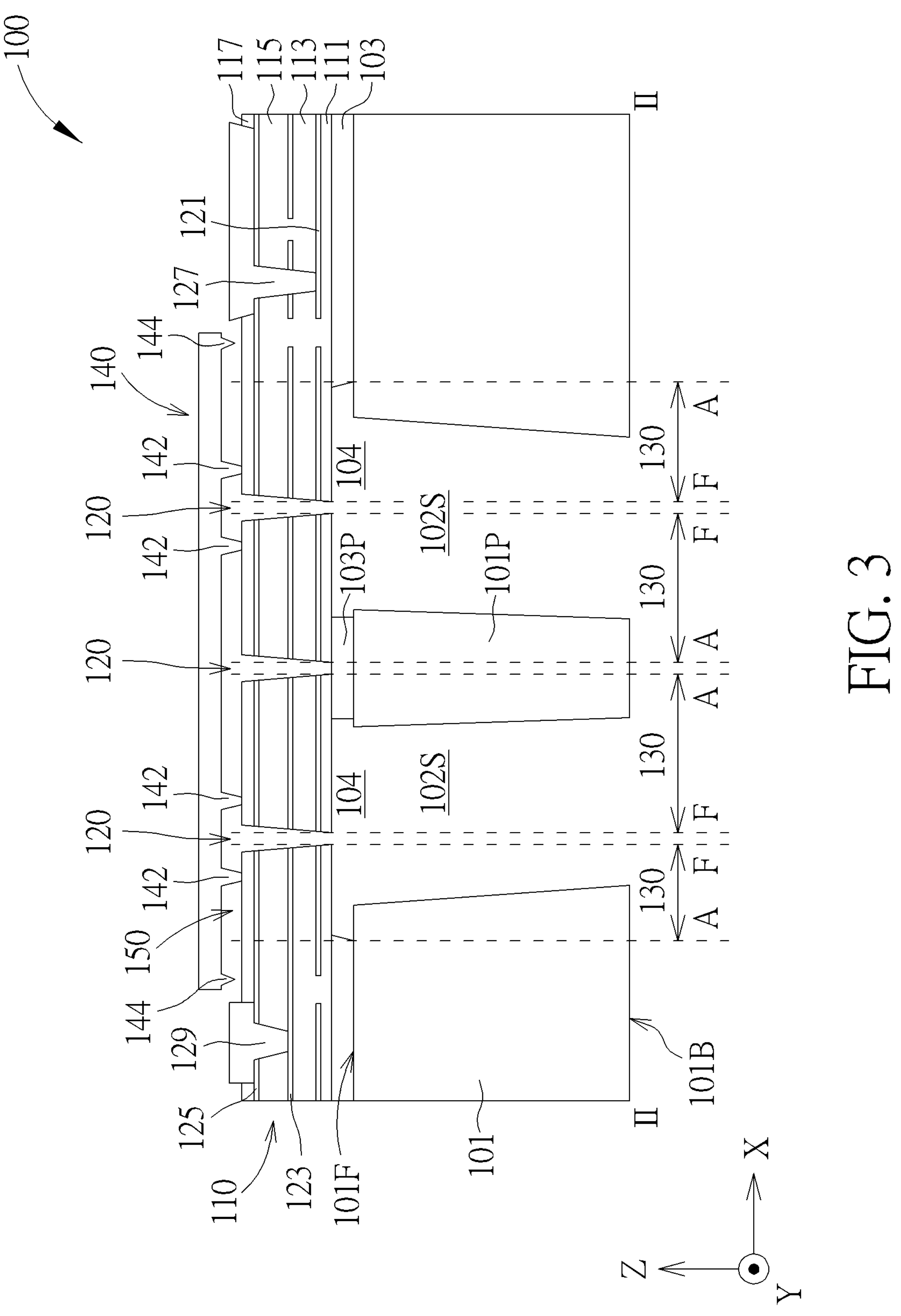
FIG. 3 shows a schematic cross-sectional diagram of a MEMS device according to further another embodiment of the present disclosure.

FIG. 3 shows a schematic cross-sectional diagram of a MEMS device 100 according to further another embodiment of the present disclosure. The difference between the MEMS devices 100 of FIG. 3 and FIG. 2 is that the sub-cavities 102S of the MEMS device 100 of FIG. 3 penetrate the substrate 101 without the common cavity 102C of FIG. 2. The portion 101P of the substrate 101 is extended from the front surface 101F to the back surface 101B of the substrate 101. In addition, the membrane 140 of the MEMS device 100 of FIG. 3 further includes a plurality of anti-stiction stoppers 144 protruding towards and separated from the MEMS structure 110 by a tiny gap that is much smaller than the gap 105 between the suspended portion 141 of the membrane 140 and the MEMS structure 110. In some embodiments, the anti-stiction stoppers 144 are disposed at the edges of the membrane 140. The anti-stiction stopper 144 may be a cone or a pyramid. During the operation of the MEMS device 100, when environmental signals such as sound waves exerts acoustic pressure on or electrical signals are applied to the MEMS structure 110, the free ends F of the cantilevered portions 130 of the MEMS structure 110 may bend or vibrate. In this embodiment, the anti-stiction stoppers 144 of the membrane 140 may be in contact with the MEMS structure 110 while the cantilevered portions 130 bend or vibrate, thereby avoiding the membrane 140 from sticking to the MEMS structure 110. In this embodiment, the more and smaller cantilever portions 130 can generate more anchor ends A and more free ends F to further increase electrical signal output, thereby improving the sensitivity of the MEMS device 100. The materials and the other details of the features of the MEMS device 100 of FIG. 3 may refer to the aforementioned descriptions of FIG. 1 and FIG. 2.

Figure 4:
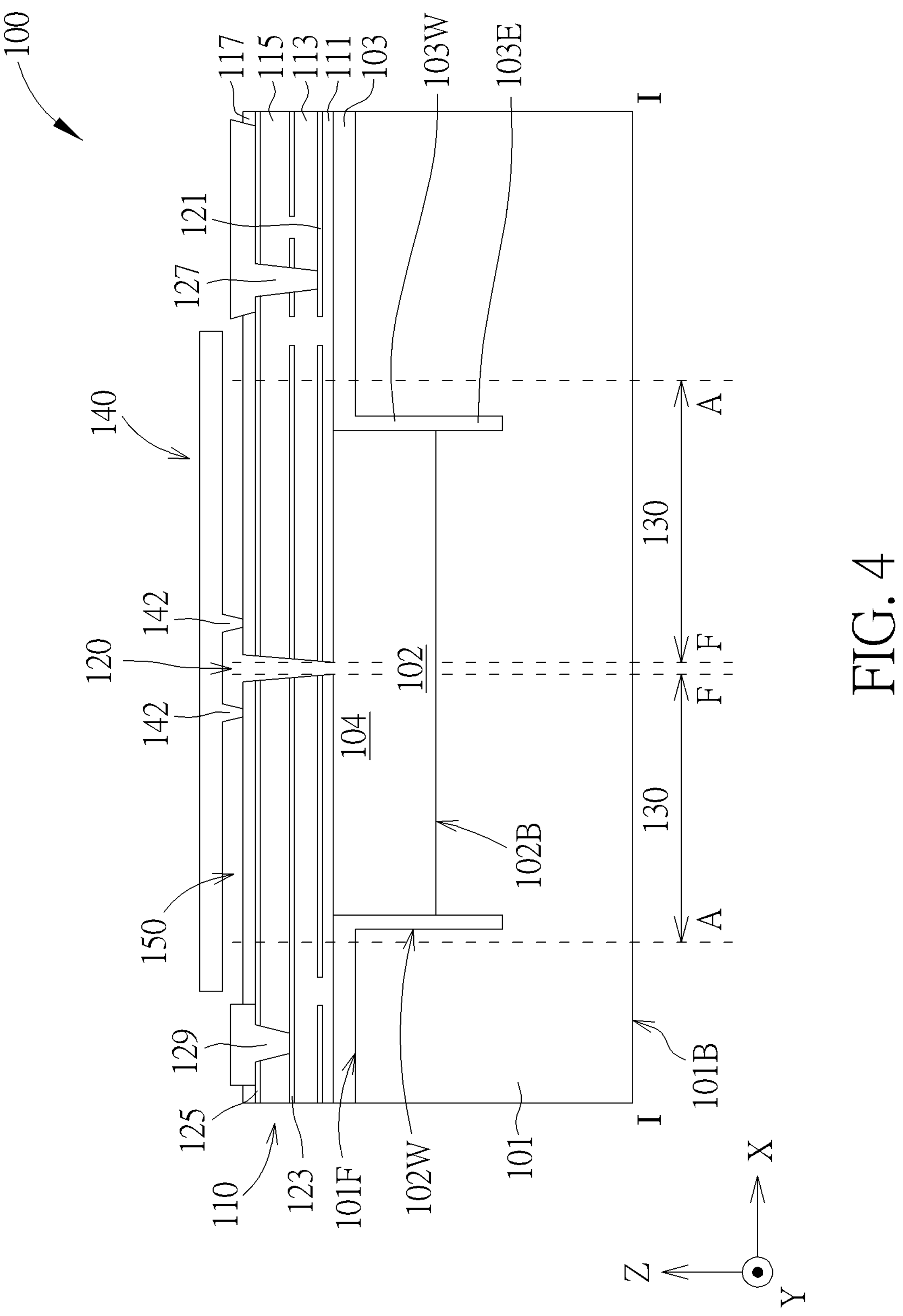
FIG. 4 shows a schematic cross-sectional diagram of a MEMS device according to yet another embodiment of the present disclosure.

FIG. 4 shows a schematic cross-sectional diagram of a MEMS device 100 according to another embodiment of the present disclosure. The difference between the MEMS devices 100 of FIG. 4 and FIG. 1 is that the cavity 102 does not penetrate the substrate 101. In this embodiment, the cavity 102 is extended from the front surface 101F of the substrate 101 to a position in the height of the substrate 101 and the bottom surface 102B of the cavity 102 is in the substrate 101. The MEMS device 100 of FIG. 4 includes a sacrificial layer 103 disposed between the substrate 101 and the MEMS structure 110. Moreover, the sacrificial layer 103 further includes a portion 103W disposed along the sidewalls 102W of the cavity 102 and another portion 103E extended into the substrate 101. The sacrificial layer 103 has an opening 104 connected to the cavity 102. The width of the opening 104 may be the same as the width of the cavity 102 in the X-axial direction. The cavity 102 and the opening 104 are formed by an etching process and released from the front side of the MEMS device 100. The portions 103W and 103E of the sacrificial layer 103 may confine and control the dimensions of the cavity 102. In this embodiment, the membrane 140 also increases the sensing area to improve the sensitivity of the MEMS device 100 without enlarging the dimensions of the MEMS device 100. The materials and the other details of the features of the MEMS device 100 of FIG. 4 may refer to the aforementioned description of FIG. 1.

Figure 5:
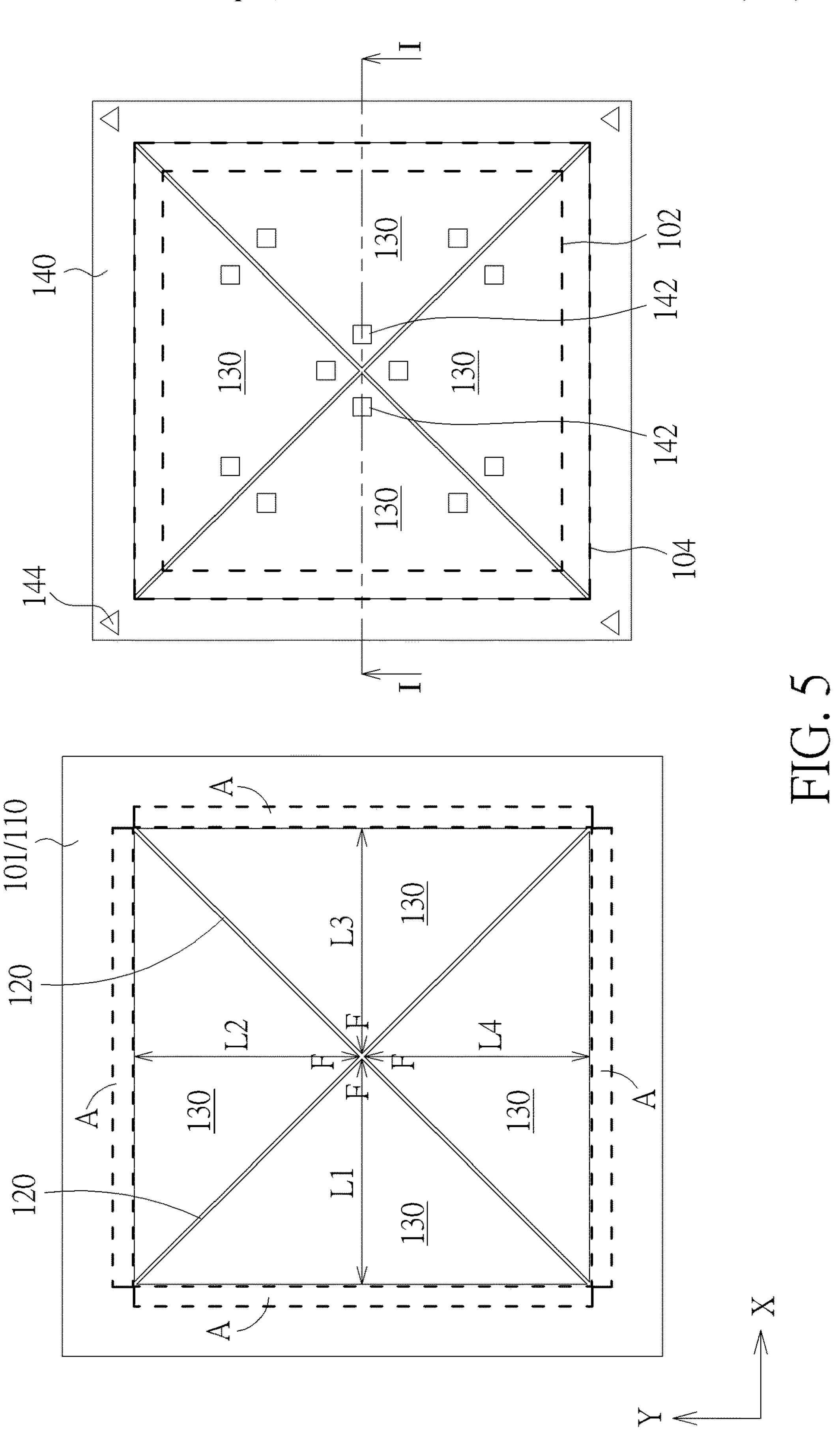
FIG. 5 shows schematic top views of a MEMS structure, a substrate and a membrane of a MEMS device according to one embodiment of the present disclosure.

FIG. 5 shows schematic top views of a MEMS structure 110, a substrate 101 and a membrane 140 of a MEMS device according to one embodiment of the present disclosure. The cross-sectional diagram of the MEMS device 100 of FIG. 1 may be taken along the cross-sectional line I-I of FIG. 5. As shown in FIG. 5, in one embodiment, the MEMS structure 110 includes four cantilevered portions 130 separated from each other by interrupted portions 120. In this embodiment, each cantilevered portion 130 is a triangle, and the interrupted portions 120 are intersected to form an X-shape. Each cantilevered portion 130 has an anchor end A located at the base of the triangle and a free end F located at the top of the triangle. The four cantilevered portions 130 have four distances L1, L2, L3 and L4, respectively, where each distance is from the anchor end A to the free end F. The distances L1, L2, L3 and L4 may be the same as or different from each other. In addition, the four cantilevered portions 130 are connected together by a portion of the MEMS structure 110 surrounding the four cantilevered portions 130. Accordingly, portions of the first electrode layer 121 in the four cantilever portions 130 are electrically connected in series, portions of the second electrode layer 123 in the four cantilever portions 130 are electrically connected in series, and portions of the third electrode layer 125 in the four cantilever portions 130 are electrically connected in series. Therefore, electrical signals generated in the four cantilever portions 130 may be transmitted through the same contact pad.

Furthermore, as shown in FIG. 5, when viewed from a top view, the edges of the membrane 140 are extended outwards beyond the edges of the cavity 102. Moreover, the edges of the opening 104 of the sacrificial layer 103 may be extended outwards beyond the edges of the cavity 102. In one embodiment, the membrane 140 has twelve protruding portions 142 connected to the free ends F of the four cantilever portions 130 and the sides of the four cantilever portions 130. In another embodiment, the membrane 140 may have four protruding portions 142 connected to the free ends F of the four cantilever portions 130. In addition, the membrane 140 may have four anti-stiction stoppers 144 disposed at the edges of the membrane 140, but not limited thereto. For example, the number of the anti-stiction stoppers 144 may be two, three or more than four.

Figure 6:
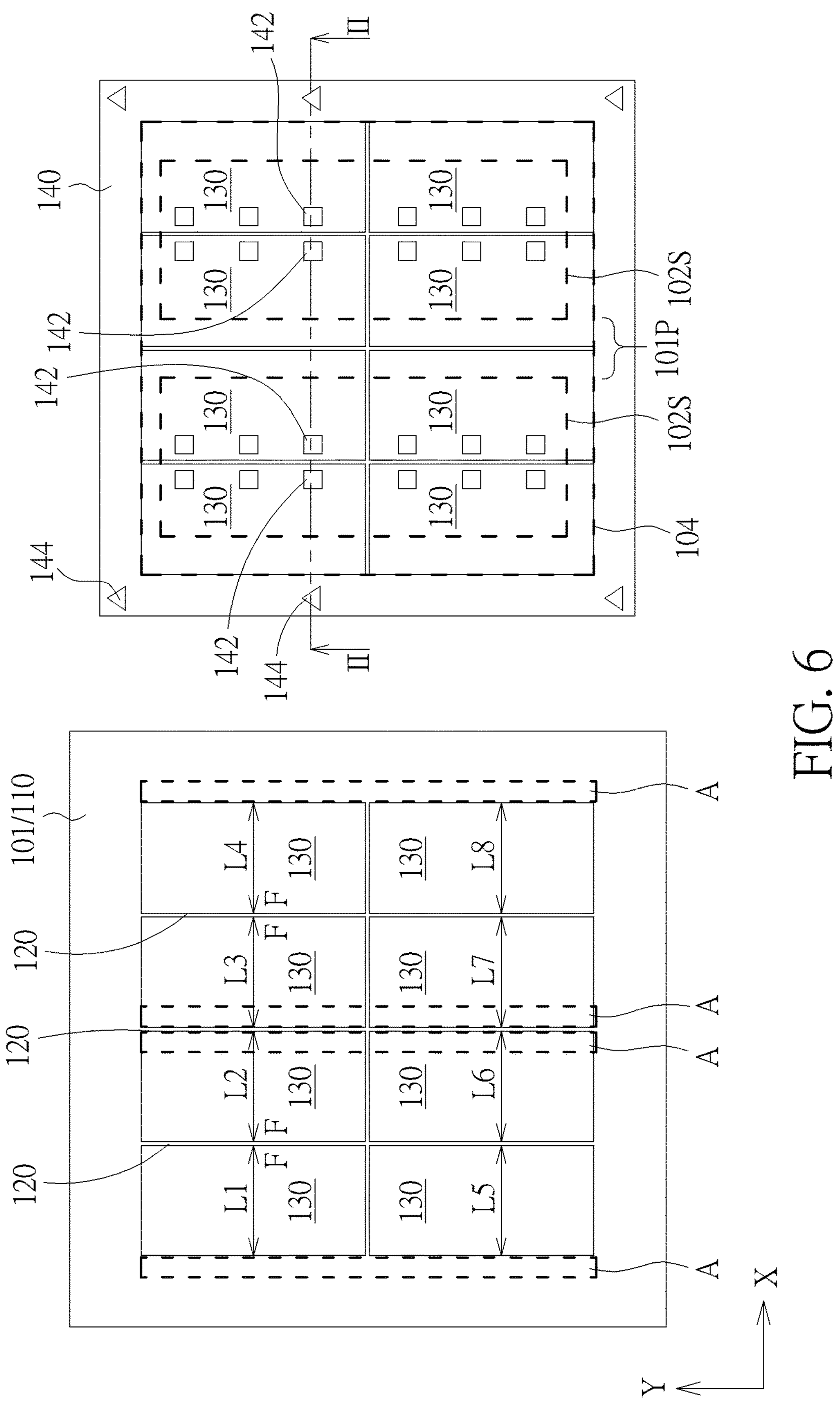
FIG. 6 shows schematic top views of a MEMS structure, a substrate and a membrane of a MEMS device according to another embodiment of the present disclosure.

FIG. 6 shows schematic top views of a MEMS structure 110, a substrate 101 and a membrane 140 of a MEMS device according to another embodiment of the present disclosure. The cross-sectional diagram of the MEMS device 100 of FIG. 3 may be taken along the cross-sectional line II-II of FIG. 6. As shown in FIG. 6, in one embodiment, the MEMS structure 110 includes eight cantilevered portions 130 separated from each other by interrupted portions 120. In this embodiment, each cantilevered portion 130 is a rectangular, and the interrupted portions 120 are intersected to form a cross-shape. The four outer cantilevered portions 130 in the X-axial direction have anchor ends A located at the outer sides of the rectangles and free ends F opposite to the anchor ends A. The four inner cantilevered portions 130 in the X-axial direction have anchor ends A located at the inner sides of the rectangles and free ends F opposite to the anchor ends A. The anchor end A and the free end F of each cantilevered portion 130 are located on opposite sides of the rectangular. The anchor ends A of the four inner cantilevered portions 130 are attached to the portion 101P of the substrate 101 as shown in FIG. 3. The eight cantilevered portions 130 have eight distances L1 to L8, respectively, where each distance is from the anchor end A to the free end F. The eight distances L1 to L8 may be the same as or different from each other. In addition, the eight cantilevered portions 130 are connected together by a portion of the MEMS structure 110 surrounding the eight cantilevered portions 130. The portion of the MEMS structure 110 has connecting parts that are connected to the eight cantilevered portions 130. Accordingly, portions of the first electrode layer 121 in the eight cantilever portions 130 are electrically connected in series, portions of the second electrode layer 123 in the eight cantilever portions 130 are electrically connected in series, and portions of the third electrode layer 125 in the eight cantilever portions 130 are electrically connected in series. Therefore, electrical signals generated in the eight cantilever portions 130 may be transmitted through the same contact pad. The number of the cantilevered portions 130 is not limited to eight. For example, the number of the rectangular cantilevered portions 130 may be two, four, six or more than eight.

In addition, as shown in FIG. 6, in one embodiment, the substrate 101 has two sub-cavities 102S separated by the portion 101P of the substrate 101. When viewed from a top view, the edges of the membrane 140 are extended outwards beyond the edges of the two sub-cavities 102S. Moreover, the edges of the opening 104 of the sacrificial layer 103 may be extended outwards beyond the edges of the two sub-cavities 102S. In other embodiments, the number of the sub-cavities 102S is not limited to two. For example, the number of the sub-cavities 102S may be four, six or more that are adjusted based on the layout of the cantilevered portions 130 and the interrupted portions 120. The membrane 140 may have twenty-four protruding portions 142 connected to the free ends F of the eight cantilever portions 130, but not limited thereto. For example, the number of the protruding portions 142 may be eight, sixteen or other multiples of 8. In addition, the membrane 140 may have six anti-stiction stoppers 144 disposed at the edges of the membrane 140, but not limited thereto. For example, the number of the anti-stiction stoppers 144 may be two, four or more than six.

Figure 7:
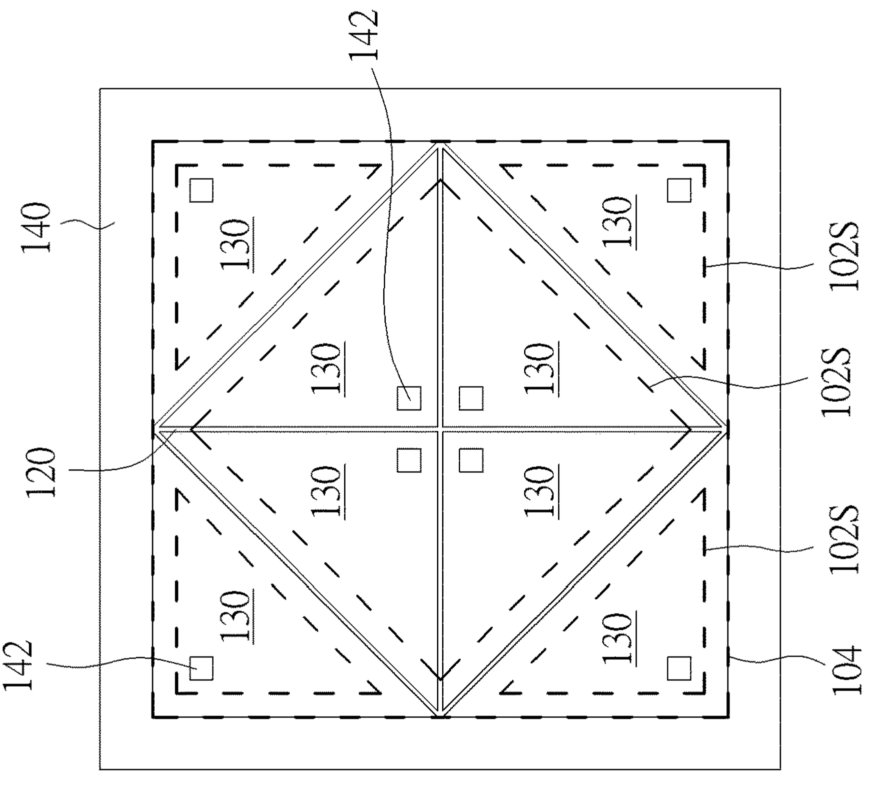
FIG. 7 shows schematic top views of a MEMS structure, a substrate and a membrane of a MEMS device according to further another embodiment of the present disclosure.
Figure 7:
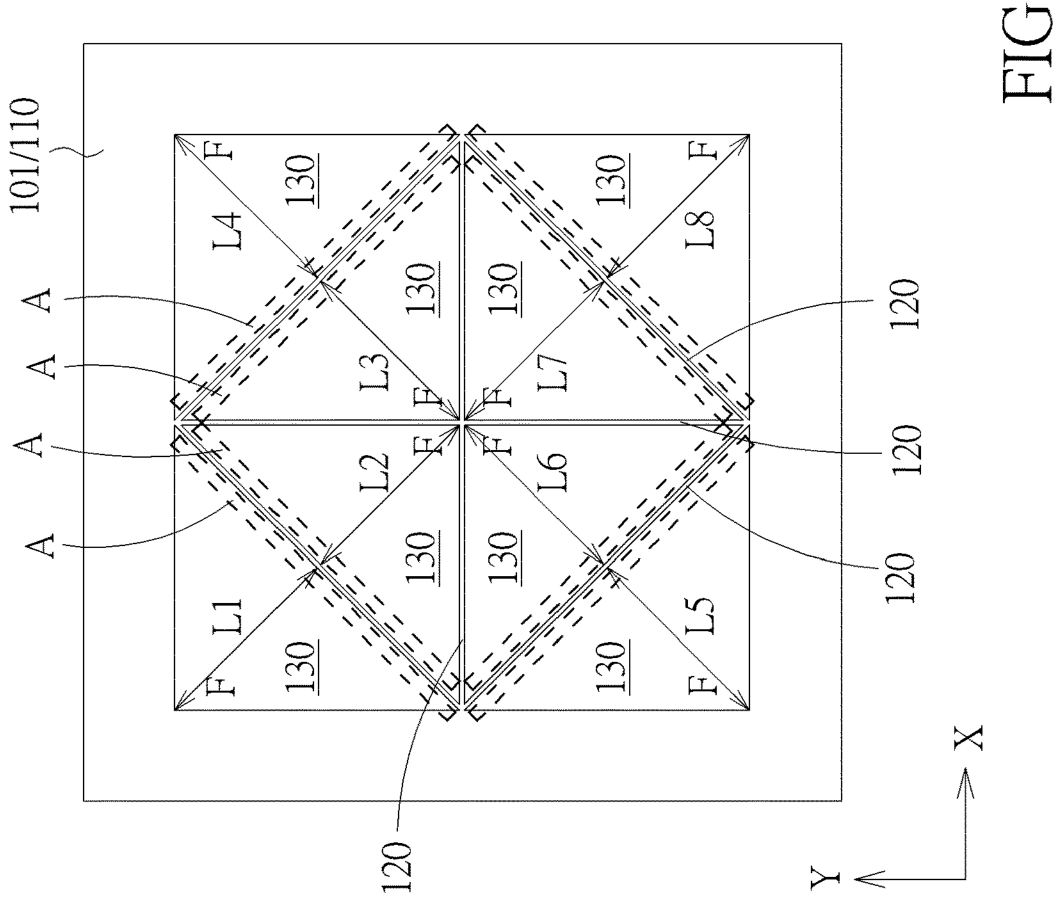

FIG. 7 shows schematic top views of a MEMS structure 110, a substrate 101 and a membrane 140 of a MEMS device according to further another embodiment of the present disclosure. As shown in FIG. 7, in one embodiment, the MEMS structure 110 includes eight cantilevered portions 130 separated from each other by interrupted portions 120. In this embodiment, each cantilevered portion 130 is a triangle, and the interrupted portions 120 are intersected to form a cross shape and a rhombus. Each cantilevered portions 130 has an anchor end A located at the base of the triangle and a free end F located at the top of the triangle. The eight cantilevered portions 130 have eight distances L1 to L8, respectively, where each distance is from the anchor end A to the free end F. The eight distances L1 to L8 may be the same as or different from each other. In addition, the eight cantilevered portions 130 are connected together by a portion of the MEMS structure 110 surrounding the eight cantilevered portions 130. For example, the portion of the MEMS structure 110 has connecting parts that are connected to the corners at the anchor ends A of the eight cantilevered portions 130. Accordingly, portions of the first electrode layer 121 in the eight cantilever portions 130 are electrically connected in series, portions of the second electrode layer 123 in the eight cantilever portions 130 are electrically connected in series, and portions of the third electrode layer 125 in the eight cantilever portions 130 are electrically connected in series. Therefore, electrical signals generated in the eight cantilever portions 130 may be transmitted through the same contact pad.

Furthermore, as shown in FIG. 7, in one embodiment, the substrate 101 has five sub-cavities 102S separated by the portion 101P of the substrate 101. When viewed from a top view, the edges of the membrane 140 are extended outwards beyond the edges of the five sub-cavities 102S. Moreover, the edges of the opening 104 of the sacrificial layer 103 may be extended outwards beyond the edges of the five sub-cavities 102S. The layout of the sub-cavities 102S is adjusted based on the layout of the cantilevered portions 130 and the interrupted portions 120. The membrane 140 may have eight protruding portions 142 connected to the free ends F of the eight cantilever portions 130, but not limited thereto. For example, the number of the protruding portions 142 may be other multiples of 8.

Figure 8:
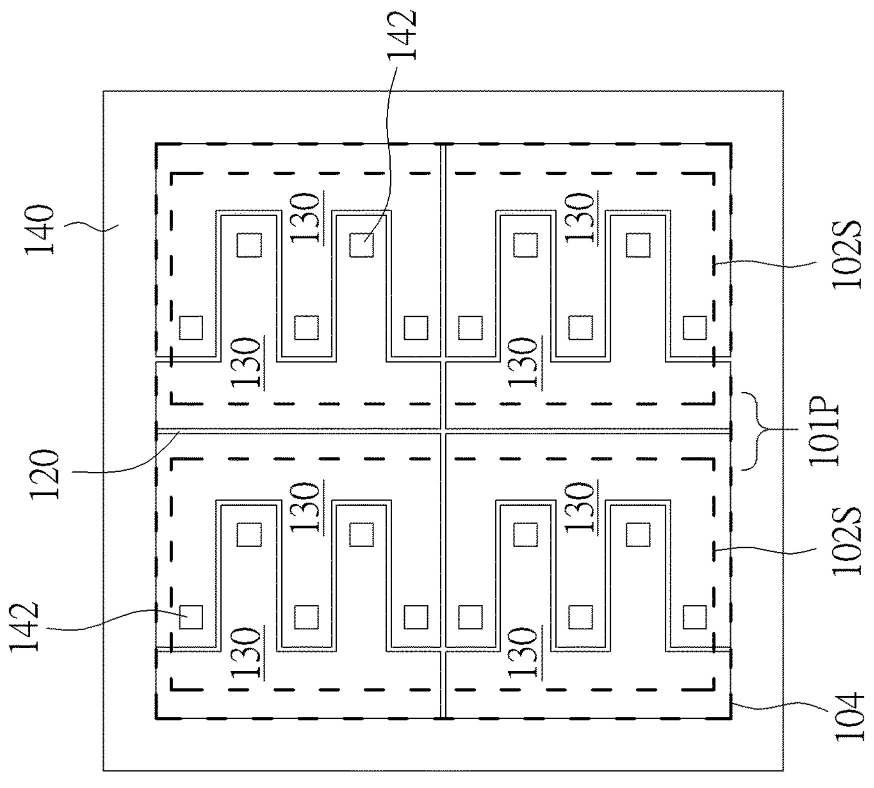
FIG. 8 shows schematic top views of a MEMS structure, a substrate and a membrane of a MEMS device according to yet another embodiment of the present disclosure.
Figure 8:
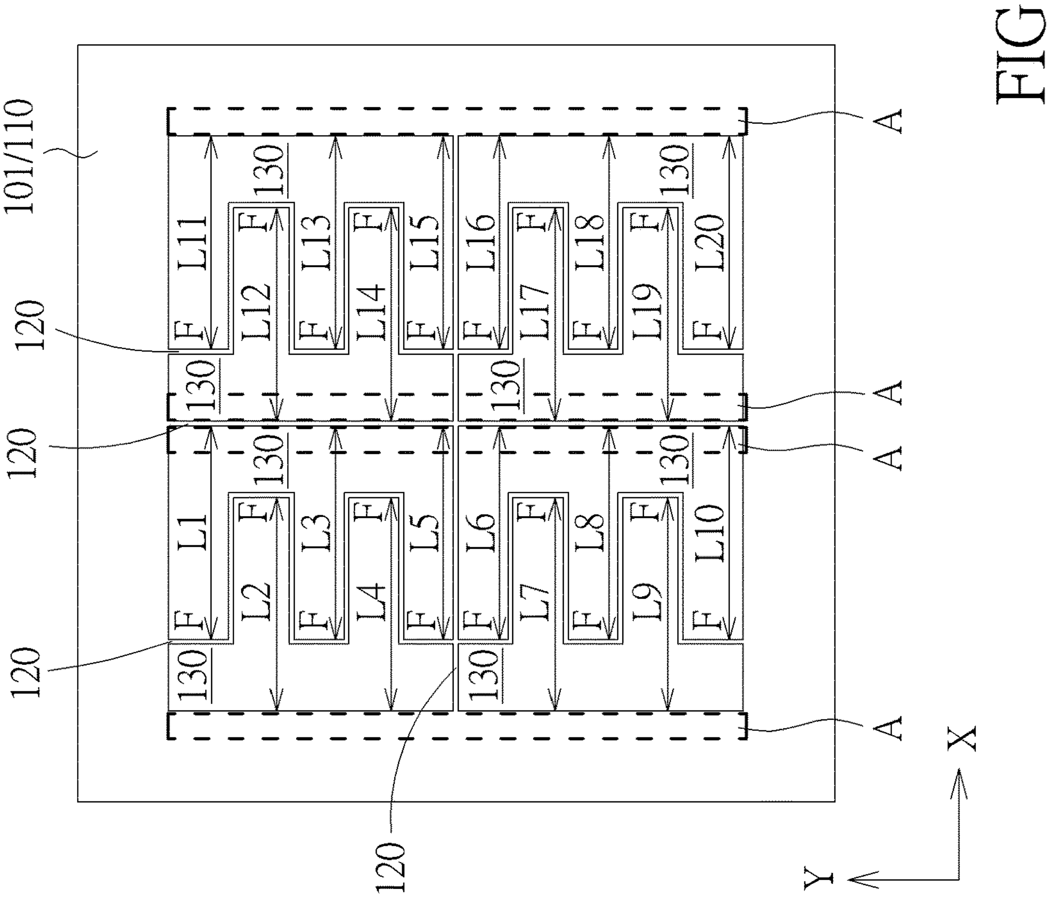

FIG. 8 shows schematic top views of a MEMS structure 110, a substrate 101 and a membrane 140 of a MEMS device according to another embodiment of the present disclosure. As shown in FIG. 8, in one embodiment, the MEMS structure 110 includes eight cantilevered portions 130 laterally separated from each other by interrupted portions 120. Each cantilevered portions 130 has an interdigitated shape, and two adjacent cantilevered portions 130 are interlocked with each other. The interrupted portions 120 are intersected to form a cross shape and have a square-wave shape between the two adjacent interdigitated cantilevered portions 130. Each cantilevered portion 130 has an anchor end A located at the base of the interdigitated shape and has two or three free ends F located at the ends of fingers of the interdigitated shape. The eight cantilevered portions 130 have twenty distances L1 to L20, where each distance is from the anchor end A to the free end F. The twenty distances L1 to L20 may be the same as or different from each other. In addition, the eight cantilevered portions 130 are connected together by a portion of the MEMS structure 110 surrounding the eight cantilevered portions 130. For example, the portion of the MEMS structure 110 has connecting parts that are connected to the anchor ends A of the eight inner cantilevered portions 130. Accordingly, portions of the first electrode layer 121 in the eight cantilever portions 130 are electrically connected in series, portions of the second electrode layer 123 in the eight cantilever portions 130 are electrically connected in series, and portions of the third electrode layer 125 in the eight cantilever portions 130 are electrically connected in series. Therefore, electrical signals generated in the eight cantilever portions 130 may be transmitted through the same contact pad.

Furthermore, as shown in FIG. 8, in one embodiment, the substrate 101 has two sub-cavities 102S separated by the portion 101P of the substrate 101. When viewed from a top view, the edges of the membrane 140 are extended outwards beyond the edges of the two sub-cavities 102S. Moreover, the edges of the opening 104 of the sacrificial layer 103 may be extended outwards beyond the edges of the two sub-cavities 102S. The number and the layout of the sub-cavities 102S are adjusted based on the layout of the anchor ends A of the cantilevered portions 130. In addition, the membrane 140 may have twenty protruding portions 142 connected to the free ends F of the eight cantilever portions 130, but not limited thereto. The number of the protruding portions 142 is adjusted based on the number of the fingers of the cantilevered portions 130.

Figure 9:
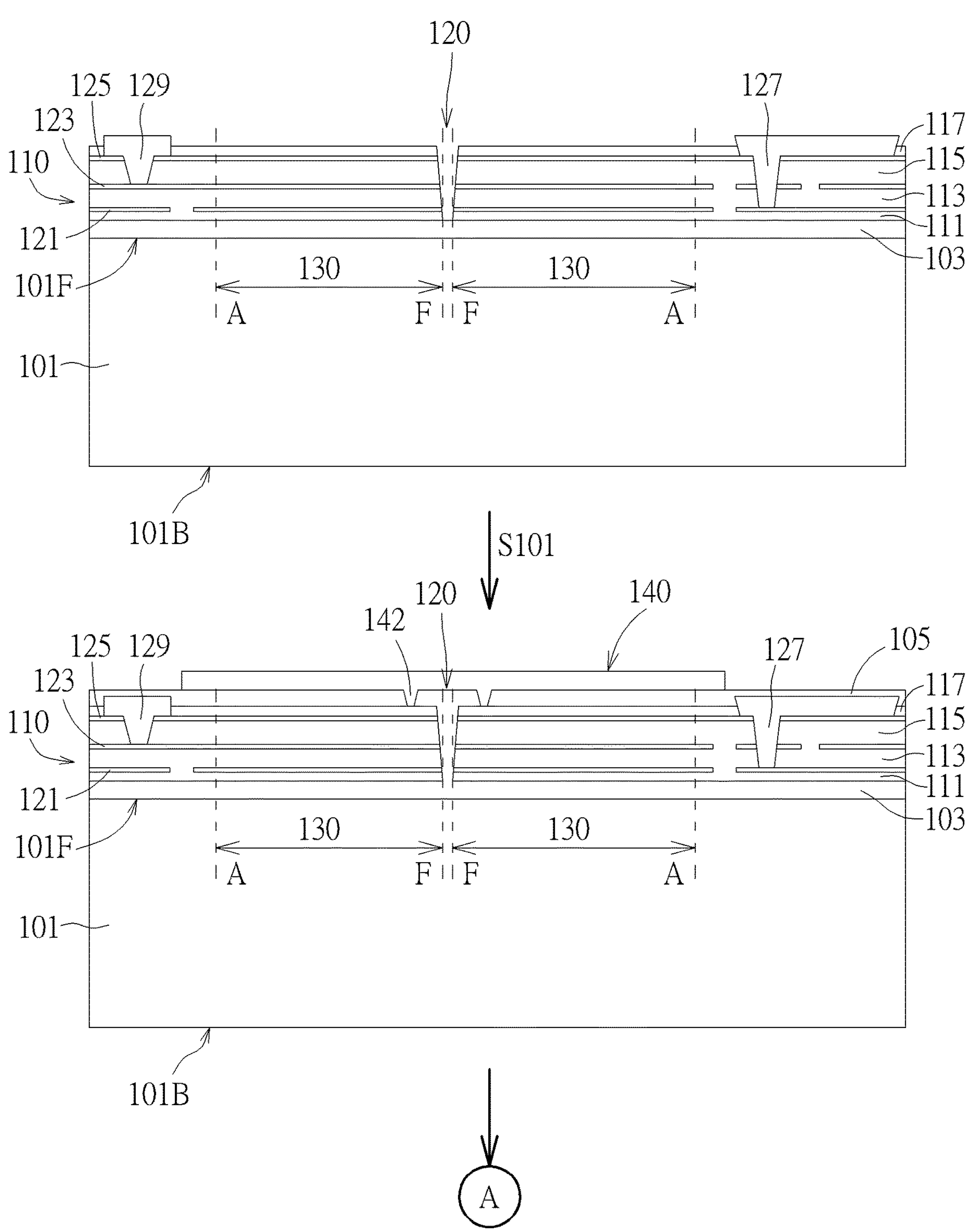
FIG. 9 and FIG. 10 show schematic cross-sectional diagrams of several stages of a method of fabricating a MEMS device according to one embodiment of the present disclosure.
Figure 10:
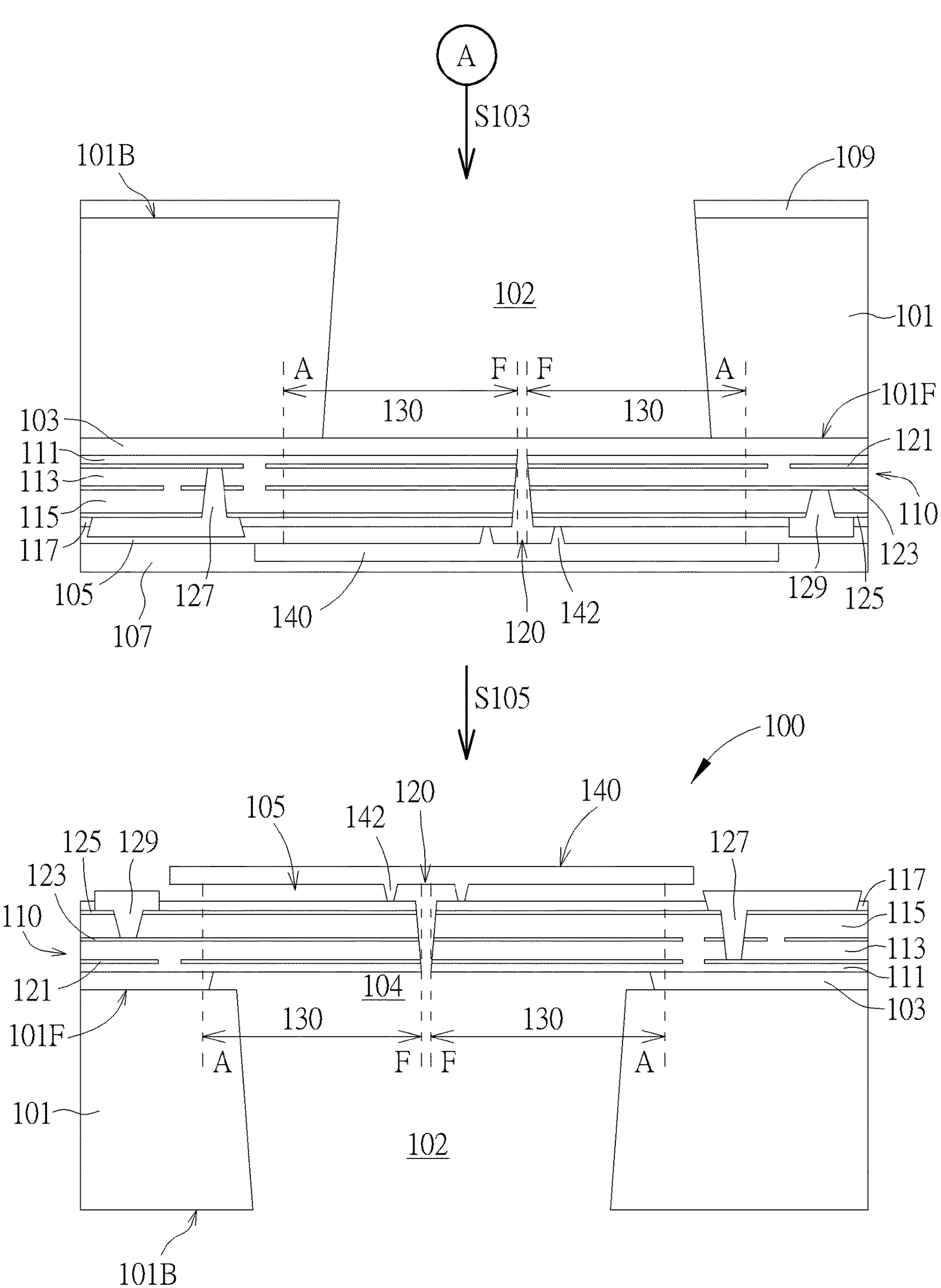

FIG. 9 and FIG. 10 show schematic cross-sectional diagrams of several stages of a method of fabricating a MEMS device according to one embodiment of the present disclosure. Referring to FIG. 9, firstly, a substrate 101 such as a silicon substrate is provided. A sacrificial layer 103 such as a silicon oxide layer is then deposited on the front surface 101F of the substrate 101. Then, a seed layer 111, a first electrode layer 121, a sensing material layer 113, a second electrode layer 123, another sensing material layer 115, a third electrode layer 125, and a passivation layer 117 are formed on the sacrificial layer 103 from bottom to top in sequence. The first electrode layer 121, the second electrode layer 123 and the third electrode layer 125 are respectively formed by a deposition process and a patterning process. The seed layer 111, the sensing material layers 113 and 115, and the passivation layer 117 are formed respectively by a deposition process. In some embodiments, the materials of the seed layer 111 and the passivation layer 117 may be AlN. The material of the sensing material layers 113 and 115 may be a piezoelectric material such as AlN, AlN doped with Sc (ScAlN), ZnO, or PZT. Alternatively, the material of the sensing material layers 113 and 115 may be a piezoresistive material such as doped Si or SiC. The materials of the first electrode layer 121, the second electrode layer 123 and the third electrode layer 125 may be Mo. A contact pad 127 is formed on the third electrode layer 125 and electrically coupled to the first electrode layer 121 through a via. Another contact pad 129 is formed on the third electrode layer 125 and electrically coupled to the second electrode layer 123 through another via. The material of the contact pads 127 and 129 may be AlCu. In addition, the passivation layer 117, the sensing material layers 113 and 115, the electrode layers 121, 123 and 125, and the seed layer 111 are etched to form an interrupted portion 120, thereby forming cantilevered portions 130 of a MEMS structure 110.

Next, still referring to FIG. 9, at step S101, another sacrificial layer 105 such as a silicon oxide layer is formed by a deposition process to fill up the interrupted portion 120 and on the surface of the MEMS structure 110 to cover the contact pads 127 and 129. Then, the sacrificial layer 105 is etched to form holes for protruding portions of a membrane.

Thereafter, a material layer for the membrane is deposited on the sacrificial layer 105 and to fill up the holes of the sacrificial layer 105. The material layer is then patterned by a photolithography and an etching process to form the membrane 140 including the protruding portions 142. The material of the membrane 140 may be Si, poly Si, Al, or polyimide. In some embodiments, the anti-stiction stoppers 144 of the membrane 140 are formed by filling up other holes in the sacrificial layer 105 with the material layer of the membrane 140. The other holes in the sacrificial layer 105 are shallower than the holes for forming the protruding portions 142.

Next, referring to FIG. 10, at step S103, a protective layer 107 such as a silicon oxide layer is deposited to cover the membrane 140 and the MEMS structure 110. A hard mask 109 having an opening is formed on the back surface 101B of the substrate 101. The material of the hard mask 109 is for example silicon nitride or silicon oxide. Then, the substrate 101 is etched by applying an etchant through the opening of the hard mask 109 to form a cavity 102. Thereafter, the hard mask 109 is removed. In one embodiment, the cavity 102 penetrates the substrate 101. The cavity 102 is extended from the back surface 101B of the substrate 101 and stopped on the sacrificial layer 103.

Thereafter, still referring to FIG. 10, at step S105, the sacrificial layer 103 is etched to form an opening 104, and the sacrificial layer 105 and the protective layer 107 are removed to release the MEMS structure 110 and the membrane 140 by applying an etchant such as vapor hydrofluoric acid (VHF) through the cavity 102 and the opening 104 to complete the MEMS device 100.

According to the embodiments of the present disclosure, the MEMS devices include the membrane vertically coupled with the MEMS structure. The MEMS structure includes multiple cantilever portions. Each cantilever portion includes an anchor end and a free end. The membrane provides a larger area to sense environmental signals and includes multiple protruding portions connected to the free ends of the cantilever portions to increase the sensing area, thereby improving the sensitivity of the MEMS devices. The membrane is vertically integrated with the MEMS structure, thereby increasing the sensing area without enlarging the dimensions of the MEMS devices.

In addition, according to the embodiments of the present disclosure, the number of the cantilever portions of the MEMS structure may be increased and the dimensions of the cantilever portions may be reduced to further increase the electrical signal output while maintain the same sensing area without enlarging the dimensions of the MEMS device. Moreover, the MEMS structure of the MEMS devices is applicable for both piezoelectric and piezoresistive sensors. The MEMS devices are applicable for a pressure sensor, a microphone, an energy harvester, an accelerometer, etc.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A micro-electro-mechanical system (MEMS) device, comprising:

a substrate having a cavity;

a MEMS structure disposed over the cavity and attached to the substrate, wherein the MEMS structure comprises a plurality of cantilever portions, and each of the plurality of cantilever portions comprises a free end and an anchor end;

a membrane disposed over the MEMS structure, wherein the membrane comprises a plurality of protruding portions respectively connected to the free ends of the plurality of cantilever portions; and a gap disposed between the MEMS structure and the membrane, wherein the gap surrounds the plurality of protruding portions, wherein two anchor ends of two of the plurality of cantilever portions are attached to a portion of the substrate, and an interrupted portion penetrating the MEMS structure is disposed directly above the portion of the substrate.

2. The MEMS device of claim 1, wherein the plurality of cantilever portions are arranged in an array, and each of the plurality of cantilever portions comprises a triangle, a rectangle or an interdigitated shape.

3. The MEMS device of claim 1, wherein the anchor end of each of the plurality of cantilever portion is attached to the substrate.

4. The MEMS device of claim 1, wherein the cavity comprises a plurality of sub-cavities, and the plurality of sub-cavities are separated from each other by the portion of the substrate.

5. The MEMS device of claim 4, wherein the substrate comprises a first surface adjacent to the MEMS structure and a second surface opposite to the first surface, and the plurality of sub-cavities are extended from the first surface to a position in the height of the substrate.

6. The MEMS device of claim 5, wherein the cavity further comprises a common cavity extended from the second surface to the position in the height of the substrate and connected to the plurality of sub-cavities.

7. The MEMS device of claim 1, wherein the substrate comprises a first surface adjacent to the MEMS structure and a second surface opposite to the first surface, the cavity is extended from the first surface to a position in the height of the substrate, and a bottom surface of the cavity is in the substrate.

8. The MEMS device of claim 7, further comprising a sacrificial layer disposed between the substrate and the MEMS structure, wherein the sacrificial layer has an opening connected to the cavity, and a portion of the sacrificial layer is disposed along a sidewall of the cavity and another portion of the sacrificial layer is extended into the substrate.

9. The MEMS device of claim 1, further comprising a sacrificial layer disposed between the substrate and the MEMS structure, wherein the sacrificial layer has an opening connected to the cavity.

10. The MEMS device of claim 1, wherein the MEMS structure comprises a first electrode layer, a second electrode layer and a sensing material layer disposed between the first electrode layer and the second electrode layer, portions of the first electrode layer in the plurality of cantilever portions are electrically connected in series, and portions of the second electrode layer in the plurality of cantilever portions are electrically connected in series.

11. The MEMS device of claim 10, wherein the sensing material layer comprises a piezoelectric material or a piezoresistive material.

12. The MEMS device of claim 1, wherein the composition of the membrane comprises a semiconductor material, a metal material or a polymer material.

13. The MEMS device of claim 1, wherein the membrane further comprises an anti-stiction stopper protruding towards the MEMS structure and separated from the MEMS structure.

14. The MEMS device of claim 13, wherein the anti-stiction stopper is disposed at an edge of the membrane.

15. The MEMS device of claim 1, wherein when viewed from a top view, edges of the membrane are extended outwards beyond edges of the cavity.

16. The MEMS device of claim 1, wherein the plurality of cantilever portions are separated from each other by the interrupted portion penetrating the MEMS structure.

17. The MEMS device of claim 1, wherein the plurality of protruding portions are laterally separated from each other by the gap.

18. The MEMS device of claim 1, wherein each of the plurality of protruding portions is in a columnar shape.

19. The MEMS device of claim 1, wherein the membrane further comprises a suspended portion vertically separated from the MEMS structure.

20. The MEMS device of claim 1, further comprising a sacrificial layer disposed between the substrate and the MEMS structure, wherein the sacrificial layer has an opening to expose a portion of a front surface of the substrate.

* * * * *